(12) United States Patent
Kubis et al.

(10) Patent No.: US 11,048,174 B2
(45) Date of Patent: Jun. 29, 2021

(54) METHOD OF CONTROLLING A PATTERNING PROCESS, LITHOGRAPHIC APPARATUS, METROLOGY APPARATUS LITHOGRAPHIC CELL AND ASSOCIATED COMPUTER PROGRAM

(71) Applicants: ASML NETHERLANDS B.V., Veldhoven (NL); Lam Research Corporation, Freemont, CA (US)

(72) Inventors: Michael Kubis, Meerbusch (NL); Marinus Jochemsen, Veldhoven (NL); Richard Stephen Wise, Los Gatos, CA (US); Nader Shamma, Cupertino, CA (US); Girish Anant Dixit, San Jose, CA (US); Liesbeth Reijnen, Vlijmen (NL); Ekaterina Mikhailovna Viatkina, Eindhoven (NL); Melisa Luca, Breda (NL); Johannes Catharinus Hubertus Mulkens, Valkenswaard (NL)

(73) Assignees: ASML Netherlands B.V., Veldhoven (NL); LAM Research Corporation, Fremont, CA (US)

( * ) Notice: Subject to any disclaimer, the term of this patent is extended or adjusted under 35 U.S.C. 154(b) by 203 days.

(21) Appl. No.: 16/076,231

(22) PCT Filed: Feb. 16, 2017

(86) PCT No.: PCT/EP2017/053499
§ 371 (c)(1),
(2) Date: Aug. 7, 2018

(87) PCT Pub. No.: WO2017/144343
PCT Pub. Date: Aug. 31, 2017

(65) Prior Publication Data
US 2020/0233311 A1 Jul. 23, 2020

Related U.S. Application Data

(60) Provisional application No. 62/298,882, filed on Feb. 23, 2016.

(51) Int. Cl.
*G03F 7/20* (2006.01)
*G01N 21/47* (2006.01)

(52) U.S. Cl.
CPC .......... *G03F 7/7055* (2013.01); *G01N 21/47* (2013.01)

(58) Field of Classification Search
CPC ... H01L 22/12; H01L 21/67253; H01L 31/18; H01L 51/56; G03F 7/705; G03F 7/70616;
(Continued)

(56) References Cited

U.S. PATENT DOCUMENTS

2003/0015660 A1 1/2003 Shishido et al.
2007/0050749 A1 3/2007 Ye et al.
(Continued)

FOREIGN PATENT DOCUMENTS

CN 1449577 10/2003
CN 102163000 8/2011
(Continued)

OTHER PUBLICATIONS

International Search Report and Written Opinion issued in corresponding PCT Application No. PCT/EP2017/053499, dated Jul. 10, 2017, 14 pages.
(Continued)

*Primary Examiner* — Mesfin T Asfaw
(74) *Attorney, Agent, or Firm* — Pillsbury Winthrop Shaw Pittman LLP

(57) ABSTRACT

A method, and associated apparatus and computer program, to determine corrections for a parameter of interest, such as critical dimension, of a patterning process. The method
(Continued)

includes determining an exposure control correction for an exposure control parameter and, optionally, determining a process control correction for a process control parameter, based upon a measurement of the parameter of interest of a structure, and an exposure control relationship and a process control relationship. The exposure control relationship describes the dependence of the parameter of interest on the exposure control parameter and the process control relationship describes the dependence of the parameter of interest on the process control parameter. The exposure control correction and process control correction may be co-optimized to minimize variation of the parameter of interest of subsequent exposed and processed structures relative to a target parameter of interest.

21 Claims, 4 Drawing Sheets

(58) Field of Classification Search
CPC .... G03F 7/70625; G03F 7/20; G03F 7/70683; G03F 1/70; G03F 1/84; G03F 7/0002; G03F 7/26; G03F 7/70; G03F 7/70483; G03F 7/7055; G03F 7/7065; G03F 7/70783; G03F 7/70525; G03F 1/80; G01N 21/47
See application file for complete search history.

(56) References Cited

U.S. PATENT DOCUMENTS

| 2009/0009746 A1 | 1/2009 | Auer-Jongepier et al. |
| 2011/0205511 A1 | 8/2011 | Padiy et al. |

FOREIGN PATENT DOCUMENTS

| JP | 2003173948 | 6/2003 |
| JP | 2004511897 | 4/2004 |
| JP | 2009021589 | 1/2009 |
| JP | 2011187951 | 9/2011 |
| WO | 200209170 | 1/2002 |
| WO | 2011-101187 | 8/2011 |
| WO | 2015-110210 | 7/2015 |

OTHER PUBLICATIONS

Taiwanese Office Action issued in corresponding Taiwanese Patent Application No. 106106004, dated Jan. 16, 2018, with English translation, 12 pages.
Japanese Office Action issued in corresponding Japanese Patent Application No. 2018-539397, dated Sep. 18, 2019.
Chinese Office Action issued in corresponding Chinese Patent Application No. 201780012610.5, dated Dec. 20, 2019.
Korean Office Action issued in corresponding Korean Patent Application No. 10-2018-7024012, dated Dec. 23, 2019.
Chinese office Action issued in corresponding Chinese Patent Application No. 201780012610.5, dated Feb. 1, 2021.

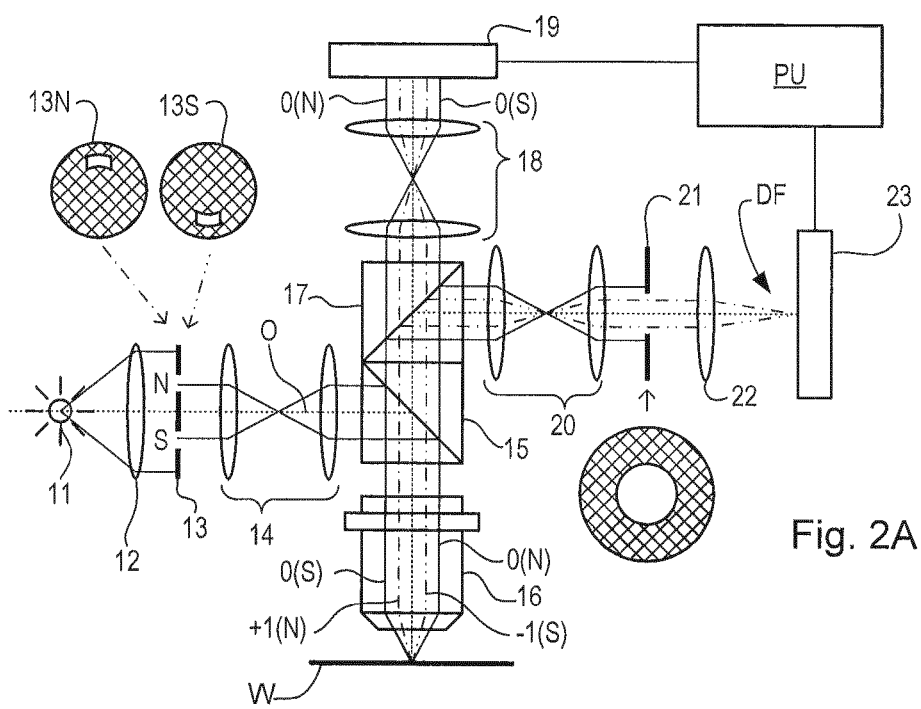
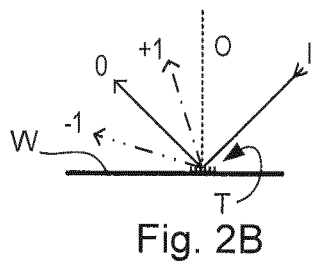
Fig. 2A
Fig. 2B

METHOD OF CONTROLLING A PATTERNING PROCESS, LITHOGRAPHIC APPARATUS, METROLOGY APPARATUS LITHOGRAPHIC CELL AND ASSOCIATED COMPUTER PROGRAM

CROSS-REFERENCE TO RELATED APPLICATIONS

This application is the U.S. national phase entry of PCT patent application no. PCT/EP2017/053499, which was filed on Feb. 16, 2017, which claims the benefit of priority of U.S. provisional application No. 62/298,882, which was filed on Feb. 23, 2016, and which is incorporated herein in its entirety by reference.

FIELD

The present disclosure relates to methods and apparatus of lithography usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

SUMMARY

A significant property of interest is critical dimension (CD). It is important that structures are formed with accurate critical dimension control over the whole substrate (e.g. wafer). This may be achieved by determining spatially resolved corrections for a control parameter of a lithographic or etch process based on measurements of CD. However, not all types of structures react the same to variation of the control parameter.

In an aspect, there is provided a method of controlling a parameter of interest for a patterning process, the method comprising: determining an exposure control correction for an exposure control parameter based upon a determination of the parameter of interest from at least one structure at a process condition, and based upon an exposure control relationship and a process control relationship, wherein the exposure control relationship describes the dependence of the parameter of interest on the exposure control parameter and the process control relationship describes the dependence of the parameter of interest on a process control parameter.

In an aspect, there is provided a lithographic apparatus, metrology apparatus or lithographic cell operable to perform a method as described herein.

In an aspect, there is provided a computer program comprising processor readable instructions which, when run on suitable processor controlled apparatus, cause the processor controlled apparatus to perform a method as described herein, and a computer program carrier comprising such a computer program. The processor controlled apparatus may comprise the aforementioned lithographic apparatus, metrology apparatus or lithographic cell.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIG. 2A is a schematic diagram of a dark field scatterometer for use in measuring targets using a first pair of illumination apertures;

FIG. 2B is a detail of a diffraction spectrum of a target grating for a given direction of illumination;

DETAILED DESCRIPTION

Before describing embodiments in detail, it is instructive to present an example environment in which embodiments may be implemented.

Figure 1:
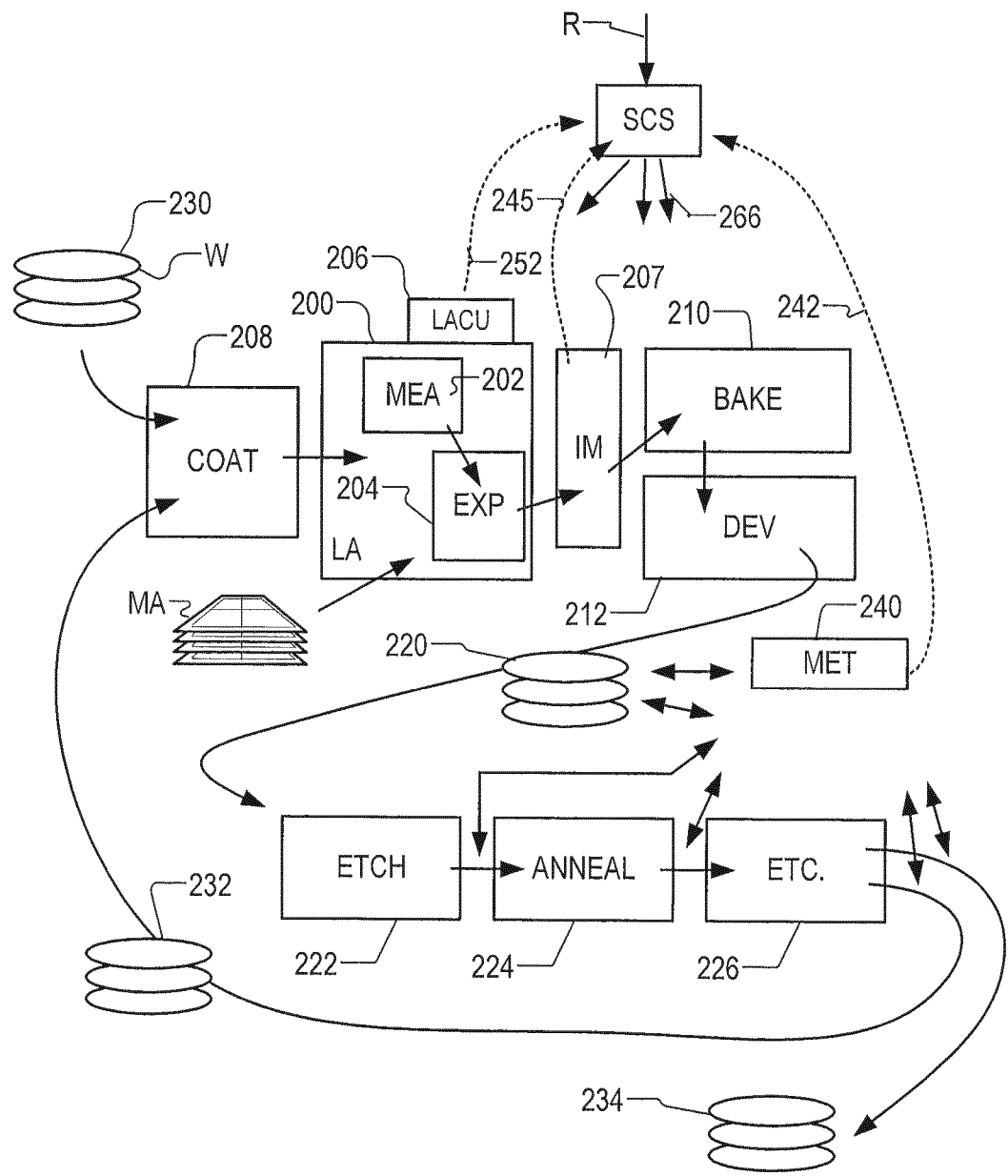
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. The control unit LACU also includes signal processing and data processing capacity to implement desired calculations relevant to the operation of the apparatus. In practice, the control unit LACU will be realized as a system of many sub-units, each handling the real-time data acquisition, processing and control of a subsystem or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and/or measuring the position of alignment marks on the substrate using an alignment sensor. The alignment marks are arranged nominally in a regular grid pattern. However, due to inaccuracies in creating the marks and also due to deformations of the substrate that occur throughout its processing, the marks can deviate from the ideal grid. Consequently, in addition to measuring position and orientation of the substrate, the alignment sensor in practice must measure in detail the positions of many marks across the substrate area, if the apparatus is to print product features at the correct locations with very high accuracy. Lithographic apparatus LA may for example be of a so-called dual stage type which has two tables and two or more stations—an exposure station and one or more measurement stations—between which the tables can be exchanged. The apparatus may have at least one substrate table and at least one measurement table (which does not hold a substrate). Measurements can be taken with the measurement table while a substrate is exposed using the substrate table. The apparatus may have two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore time-consuming and the provision of two substrate tables enables a substantial increase in the throughput of the apparatus.

Within the production facility, apparatus 200 forms part of a "litho cell" or "litho cluster" that contains also a coating apparatus 208 configured to apply photosensitive resist and/or one or more other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled 266 by a supervisory control system SCS, which also controls 266 the lithographic apparatus via lithographic apparatus control unit LACU and which can receive 252 information from the control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses 226, etc. Numerous types of operation can be required to make a real device, such as deposition of material, modification of surface material characteristics (oxidation, doping, ion implantation etc.), chemical-mechanical polishing (CMP), etching (selective removal of materials by reactive ion etch or wet etch) and so forth. The apparatus 226 may, in practice, represent a series of different processing steps performed in one or more apparatuses.

As is known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined 234 for patterning operations in a different cluster, or they may be finished products to be sent for dicing and packaging 234.

Each layer of the product structure often requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at a DUV wavelength, while others are exposed using EUV wavelength radiation.

In order that the substrates that are exposed by the lithographic apparatus are exposed correctly and consistently, it is desirable to inspect exposed substrates to measure one or more properties, such as overlay error between subsequent layers, line thickness, critical dimension (CD), etc. Accordingly a manufacturing facility in which a litho cell LC is located may also include one or more metrology systems. The metrology systems may include a stand-alone metrology apparatus MET 240 and/or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated, e.g., into the track to receive and measure some or all of the substrates W immediately after exposure. Metrology results are provided 242, 245 directly or indirectly to the supervisory control system SCS. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that a performance parameter, such as overlay or critical dimension (CD), does not meet one or more specified accuracy requirements in the developed resist. Prior to the etching step, the opportunity exists to strip the developed resist and reprocess the substrates 220 through the litho cluster. So, the metrology results 242, 245 from the apparatus 240, 207 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

A metrology apparatus is shown in FIG. 2A. The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2B. The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line 0. In this apparatus, radiation emitted by source 11 (e.g., a xenon lamp) is directed onto substrate W via an optical element 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

As shown in FIG. 2B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2A and 2B are shown somewhat off axis, purely to enable them to be more easily distinguished in the diagram.

At least the 0 and +1 orders diffracted by the target T on substrate W are collected by objective lens 16 and directed back through optical element 15. Returning to FIG. 2A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment, on-axis illumination of the targets is used and an aperture stop with an off-axis aperture is used to pass substantially only one first order of diffracted radiation to the sensor. In yet other embodiments, $2^{nd}$, $3^{rd}$ and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

It is desirable that certain properties, such as dimensions of features, formed by a patterning process (which may include any process for patterning including a lithographic process and/or an etch process) are maintained within certain specifications. Failure to do this may result in many of the devices being defective, thereby reducing yield. One property of interest is critical dimension (CD). The CD of one or more features is a dimension metric defined as important with respect to dimension control. One measure of CD control is critical dimension uniformity (CDU), or how uniform CD is from structure to structure over the whole substrate. Better control of CD will improve CDU of the final electrical devices and therefore yield. The post-etch CDU is typically seen as representative for the final device uniformity.

Post-etch CDU may be optimized by measuring CD (at different positions on one or a number of substrates) and determining and applying appropriate corrections to improve CDU (by bringing CD closer to a predefined value) in a feedback loop. There are two main control loops which can be used to achieve this CD control. A first control loop may be an exposure control loop. In the exposure control loop, CD is measured at a process condition, e.g., the post-etch CD immediately after the imaging and etch step, and an exposure control correction is determined. The exposure control correction may comprise one or more corrections for a relevant (e.g., spatially resolved) exposure control parameter such as dose (a measure of the exposure energy per unit area that the resist is subjected to during exposure) or focus (of the patterned beam during exposure) which bring the CD closer to a target CD. The corrections are then applied by the lithographic apparatus in subsequent exposures, the etch process remaining unchanged. A second control loop may be a process control loop (e.g., an etch control loop) wherein the post-etch CD is measured and a process control correction is determined. The process control correction may comprise one or more corrections for a relevant (e.g., spatially resolved) process control parameter (e.g., a control parameter of the etch process such as temperature) which brings the CD closer to a target CD. The corrections are then applied to the etch processing of subsequent substrates by the etch apparatus, the lithography exposure process remaining unchanged. Both of these methods are able to achieve good post-etch CDU for a single feature.

However, single feature optimization may not necessarily be sufficient to optimize device performance. There are a number of different features on a device, all of which should be within specification with regard to CD. However, different classes of structures can demonstrate different behaviors to a control parameter, and therefore to the determined corrections. On a basic level, two different classes of structures which may show such different behavior are dense array structures (e.g., for memory devices) and isolated structures.

Typically, systematic offsets between an intended dimension and the actual patterned dimension (post-exposure and post-etch) are compensated by patterning device biases and/or sub-resolution assist features (SRAFs), which keep both dense and isolated structures within specification after etch. The patterning device biases/SRAFs are determined by an optical proximity correction (OPC) model.

Ideally, an OPC model will keep the mean CD for both dense and isolated structures on target, within specification. A small deviation from the target CD as defined by the specification can be compensated by determining appropriate parameter corrections for the exposure process or etch process as described. However, for situations where the dense and isolated structures require different corrections, the OPC model is seen as inaccurate. For deviations out of specification, this will lead to performance loss, and a new OPC model (with consequent new patterning devices, etc.) will be needed to address this. In some circumstances, illumination settings at the exposure step can be adjusted to compensate for the systematic offset. A similar approach could be applied to the etch process as, due to loading, dense and isolated structures have a different sensitivity to many etch parameters.

Moreover, the offset between CD of dense structures and isolated structures is not constant across the substrate, but rather shows a position dependent variation. As such, a CD substrate map of dense structures shows a different fingerprint across the substrate compared to that of a CD substrate map of isolated structures. Much of the reason for the different fingerprints is the various influence factors, such as deposition, spin-on, and/or chemo-mechanical polishing-related stack variation, which affect the different classes of structures differently.

Figure 3A:
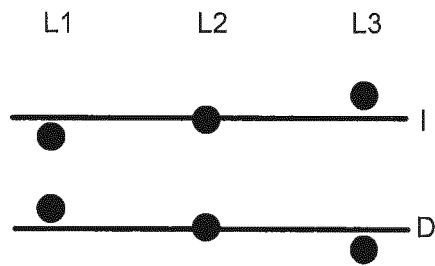
FIG. 3A illustrates schematically a best possible correction for example CD measurements of two structure classes.
Figure 3B:
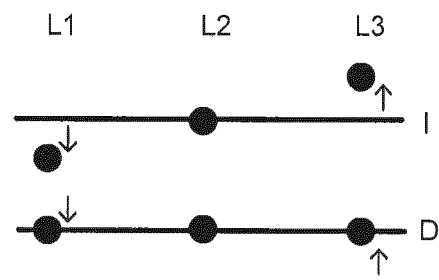
FIG. 3B illustrates schematically the effect of correcting the CD of one structure class further and its effect on the CD of the other structure class.

Because of the different fingerprints, it may be difficult to fully compensate for both fingerprints using only a single correction (e.g. a dose correction or an etch correction). For example, applying corrections which bring the dense structure CD within specification may tend to cause the isolated structure CD to fall out of specification and/or further from target (or vice versa). FIG. 3 illustrates this. In each of FIGS. 3A and 3B, the lines represent the target CD and the dots represent the actual CD for three different locations L1, L2, L3, and for isolated structures I (top) and dense structures D (bottom). In this representation, the further away a dot is shown from the line, the further away the CD is from the target CD at that location. FIG. 3A shows a best compromise correction possible with only dose correction (for either post-etch CD or post-exposure CD (which is CD measured at an exposure condition, after exposure but before etching) assuming for simplicity a 1:1 transfer between the two) or with only etch correction (for post-etch CD). FIG. 3B shows the effect of compensating further to bring the dense structure CD closer to target; this causes the isolated structure CD to deviate further from target. It will also be appreciated that the reverse can be true: compensating further to bring the isolated structure CD closer to target will cause the dense structure CD to deviate further from target.

To address the above issues, it is proposed to determine at least an exposure correction (e.g., to optimize an intra-substrate parameter of interest such as CD) based upon a determination of the parameter of interest from at least one structure at a process condition (e.g., post-processing, and particularly post-etch), and based upon an exposure control relationship and a process control relationship. The exposure control relationship describes the dependence of the parameter of interest on the exposure control parameter (e.g., focus and/or dose) and the process control relationship describes the dependence of the parameter of interest on a process control parameter (e.g., etch temperature).

In a specific embodiment, it is proposed to perform a combination of exposure corrections and process (e.g., etch) corrections to optimize intra-substrate CD fingerprints. Due to the spatial resolution available at present for etch corrections, the methods described herein are best suited to correcting for interfield effects, although they are not so limited should improved resolution etch corrections become available. In an embodiment, the method can be used for optimization of CD for only a single class of structure. This can provide some advantages over prior methods, such as extending the correction range available. In such an example, it may be that the CD fingerprint shows a large offset at certain regions on a substrate, such as in the region of the substrate edge, which results in relatively large deviations from target CD. Such large fingerprint offsets may be beyond the correction capabilities of a single correction. For example, it may be that there is insufficient correction capability in only a process correction or only an exposure correction to properly compensate for the fingerprint at such regions. The concepts described herein allow full (or at least improved) correction using a combination of process correction and exposure correction, thereby extending the possible correction range. By way of a simplified example, if an exposure correction can correct for only 3 nm of a 5 nm fingerprint at a particular location, and similarly a process correction can only correct for 3 nm of the 5 nm fingerprint at that location, then it may be that a combined (e.g., summed) process correction and exposure correction could correct for the full 5 nm fingerprint.

However, in an embodiment, the methods described herein may comprise performing a combination of an exposure correction and a process correction to optimize intra-substrate CD fingerprints for two or more classes of structures which show different CD fingerprints. The examples given are dense structures and isolated structures, but the concepts are not so limited. The concepts apply equally to any classes of structure which can be categorized generally by CD fingerprint and/or sensitivity to a particular control parameter. In an embodiment, the exposure correction and the process correction are each a high order correction, and are co-optimized to achieve CD fingerprint optimization for two or more different classes of structures. The process corrections may, for example, comprise a high order substrate fingerprint, e.g., a $15^{th}$ order (or higher) 2D polynomial to describe the substrate CDU fingerprint.

Exposure corrections involve knowledge of the exposure control relationship which, in an embodiment, describes an exposure sensitivity, e.g., how CD varies with the relevant exposure control parameter (e.g., dose and/or focus) for each structure class. Process corrections involve knowledge of the process control relationship which, in an embodiment, describes a process sensitivity, e.g., how CD varies with the relevant process control parameter (e.g., etch temperature) for each structure class. Additionally, in an embodiment these sensitivities for dense structures relative to the sensitivities for isolated structures are desirably different for the exposure corrections and the process corrections. In other words, the ratio of the sensitivities of dense structure CD and isolated structure CD to the relevant exposure control parameter should be different than the ratio of the sensitivities of dense structure CD and isolated structure CD to the relevant process control parameter. These will typically be different anyway, but where this is not the case, it is proposed that one (or both) of these ratios should be adjusted by adjusting other exposure and process parameters, to ensure that the relative sensitivities are different.

Using knowledge of the different sensitivities, dense structure CD and isolated structure CD can be adjusted at any location on the substrate to be on target. For example, the post-etch CD can be optimized for both structure classes, by biasing the post-exposure CD per substrate location such that the process corrections will act to correct the CD for both structure classes to bring them both on target. The exposure correction involves knowledge of the process sensitivities of dense structures and isolated structures of the relevant process control parameter used for tuning the corrections; whereas the process correction involves knowledge of the applied exposure correction (the applied CD bias after exposure). In this way, the exposure and process corrections are co-optimized.

Figure 4:
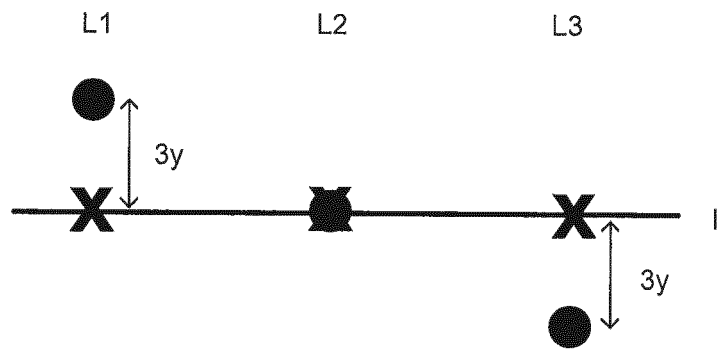
FIG. 4 illustrates schematically correction steps according to an embodiment.
Figure 4:
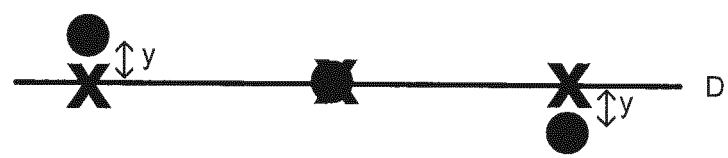

FIG. 4 illustrates this concept. In the drawing, the lines represent the target CD and the dots and crosses respectively represent the actual post-exposure CD (dots) and post-etch CD (crosses) for three different locations L1, L2, L3, and for isolated structures I (top) and dense structures D (bottom). For this specific simplified example, it is assumed that the CD of isolated structures is three times more sensitive to the relevant etch control parameter (e.g., temperature) than the CD of dense structures. Therefore the corrections devised for the exposure control parameter in this embodiment aim to bias the consequent post-exposure CD for the isolated structures three times further away (3y) from the target CD value (signified by the lines I, D for the isolated and dense structures) than the post-exposure CD for the dense structures (y). The result of this bias is that subsequent application of the appropriate etch corrections will correct CD to the target CD value for both the isolated and dense structures, as shown by the crosses.

A specific method for determining the control parameter corrections may comprise, for each of the two structure classes, combining the relationship of CD (post-exposure or post-etch, where the difference between the two should be substantially constant across the substrate and therefore should cancel) with the exposure control parameter and the relationship of the post-etch CD with the process control parameter (the latter relationship will have the post-exposure CD as its starting point), thereby finding the relationship between post-etch CD with both the exposure control parameter and the process control parameter for each structure class. These can then be solved (per substrate location) as simultaneous equations, with appropriate correction values for the exposure control parameter and process control parameter as the two unknowns to find a post-etch CD adjustment to bring the CD on target, based upon appropriate CD measurements.

The methods described herein enable theoretically ideal correction for CD of two or more different structure classes which show a different CD fingerprint, depending on the number of correction parameters available. The specific example shows two structure classes corrected using two correction parameters—one exposure parameter and one process parameter, and therefore enables theoretically ideal correction for CD of these two structure classes. Dense structures and isolated structures are only non-limiting examples of two structure classes. There may additionally be a step to determine whether structures of the structure classes selected for measurement are representative for the entire product.

Additionally, the CD of more than two structure classes can also be corrected within the scope of this disclosure using one exposure parameter and one process parameter as described, although this will not necessarily result in theoretically ideal corrections, only improved corrections over current techniques. To obtain theoretically ideal CD corrections for x different structure classes (x>2), there needs to be at least x different parameters (including at least one exposure parameter and one process parameter) which can be controlled, and for which the sensitivity relationship with CD is known and suitable. Possible exposure parameters include focus and dose, while possible process (e.g., etch) parameters include temperature and gas mixture. Such an embodiment will involve an increased understanding of the interaction of the other relevant exposure and process parameters and the resultant effects. By way of example, the use of lithography apparatus focus as an exposure control parameter will need understanding of the resultant effect on resist side wall angle and in turn, its effect on post-etch CD.

Figure 5:
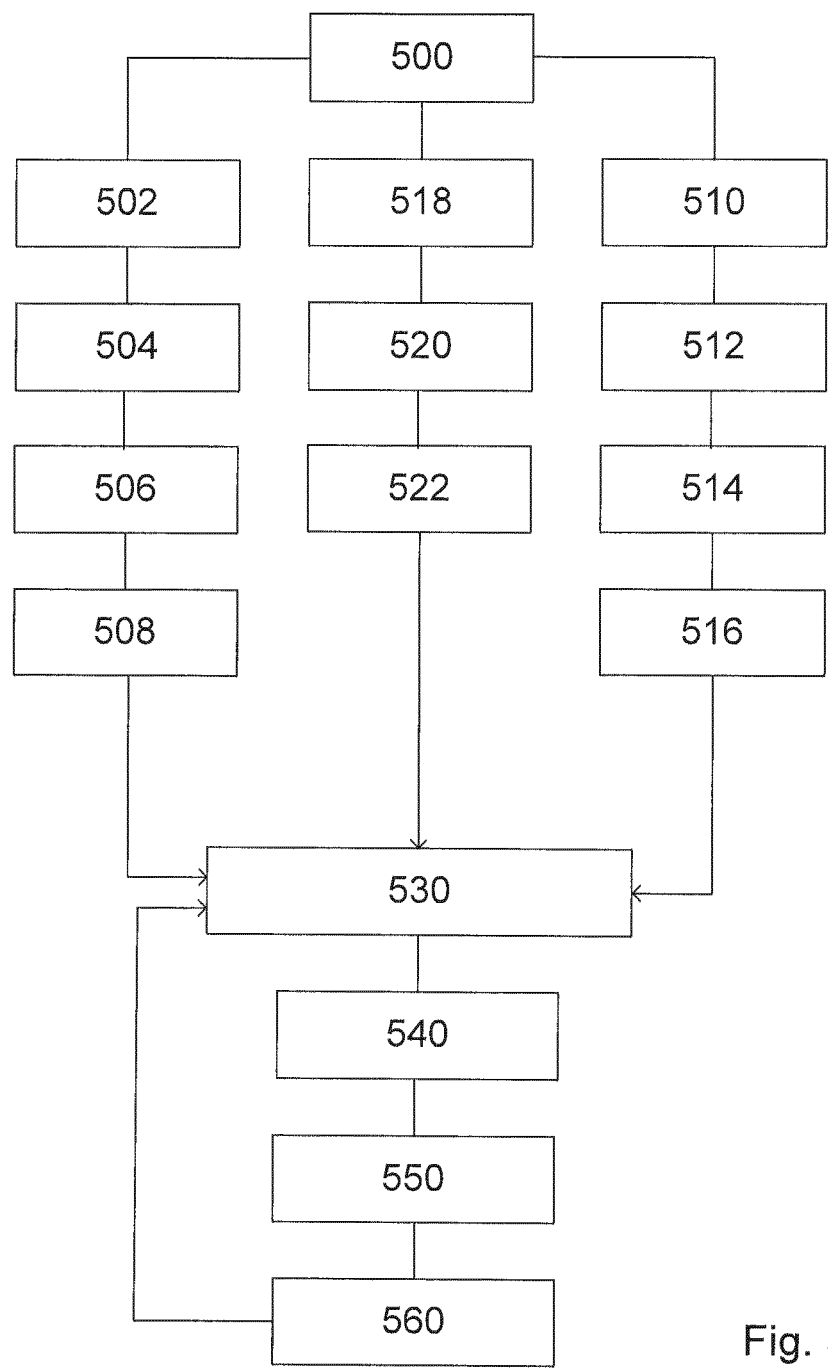
FIG. 5 is a flowchart describing a method according to an embodiment.

FIG. 5 is a flowchart of a method of control of a dimension metric during an exposure process according to an exemplary embodiment having multiple structure classes. The steps are as follows, and are then described in greater detail thereafter:

500—Begin calibration;
502—Expose exposure calibration substrate with exposure control parameter (e.g., dose or focus) variation;
504—Etch exposure calibration substrate;
506—Measure exposure calibration substrate;
508—Determine exposure control relationship between exposure control parameter and a parameter of interest (e.g., CD);
510—Expose process calibration substrate;
512—Etch process calibration substrate with process control parameter (e.g., temperature) variation;
514—Measure process calibration substrate;
516—Determine process control relationship between process control parameter and the parameter of interest;
518—Expose reference substrate
520—Etch reference substrate;
522—Measure reference substrate;
530—Determine an exposure control correction and (optionally) a process control correction for the reference substrate;
540—Perform exposure step using determined exposure control correction;
550—Optionally perform processing step using determined process control correction;
560—Measure substrate.

Step 500 indicates the beginning of calibration steps 502-522 in which one or more exposure calibration substrates, one or more process calibration substrates and one or more reference substrates are exposed, processed and measured (in parallel, partially in parallel or sequentially). Steps 502-508 refer to the exposure calibration substrate. At step 502, the exposure calibration substrate is exposed. During exposure, an exposure control parameter is varied across the substrate such that different locations are subjected to different values of the exposure control parameter. At each of these locations, one or more structures of each structure class are formed. The exposure control parameter may be dose and/or focus (note that the exposure control parameter may comprise a combination of focus and dose using, for example, a focus-exposure matrix). At step 504, the substrate is processed with a process control parameter optimized across the substrate to minimize variation of a parameter of interest (e.g., CD) with the process control parameter. This processing may comprise etching with an etch (e-chuck) temperature optimized for constant etch rate at each point on the substrate (e-chuck temperature is already used to compensate for e.g., magnetic field inhomogeneity or gas mixture variation). Such an optimization typically comprises radial temperature tuning of the e-chuck. At step 506, the substrate is measured. At step 508, the exposure control relationship between CD and the exposure control parameter is determined from the measurements of step 506, for each structure class. As an alternative to the above method, an additional post-exposure CD measurement may be performed between steps 502 and 504 to measure the substrate in resist, with the relationship determined from these measurements. Etch optimization provides the option of determining the exposure-etch CD bias (the difference between post-exposure CD measurements and post-etch CD measurements), and using this instead of directly using the post-etch CD measurement.

Steps 510-516 refer to the process calibration substrate. At step 510, the process calibration substrate is exposed with a constant exposure control parameter (e.g., constant dose) across the substrate. At step 512, the substrate is processed with a process control parameter varied across the substrate such that different locations are subjected to different values of the process control parameter. Each of these locations comprises one or more structures of each structure class. This processing may comprise etching with the etch temperature varying across the substrate. The control of the temperature may be such that the etch rate is varied across the substrate, for example. At step 514, the substrate is measured and at step 516, the process control relationship between CD and the process control parameter is determined from the measurements of step 514, for each structure class. Realistically, etch calibration requires more than one process calibration substrate to undergo steps 510-516.

Where there are two structure classes (e.g., dense and isolated structures) then steps 508 and 516 determine a first exposure control relationship describing the dependence of CD on the exposure control parameter for a first of the structure classes, a second exposure control relationship describing the dependence of CD on the exposure control parameter for a second of the structure classes, a first process control relationship describing the dependence of CD on the process control parameter for the first of the structure classes and a second process control relationship describing the dependence of CD on the process control parameter for the second of the structure classes.

At step 518, a reference substrate is exposed with structures including one or more structures from both structure classes. At step 520, the reference substrate is processed (e.g., etched); and at step 522, CD measurements are performed on the reference substrate to obtain post-etch measurements of CD (optionally post-exposure CD measurements could also be made before processing for monitoring purposes).

At step 530, an exposure control correction is determined for the exposure control parameter based on the reference substrate measurements (and their deviation from a target value) and the relationships determined above, using the methods as disclosed herein. In an embodiment, this step may comprise determining co-optimized corrections (per location) for the exposure control parameter and process control parameter. These corrections should act to bring the post-etch CD of the reference substrate towards a target CD for all structure classes at each measurement location.

At step 540 and step 550 respectively, subsequent substrates are exposed and processed using the co-optimized corrections for the exposure control parameter and (where applicable) process control parameter determined at step 530. At step 560, one or more of these subsequent substrates are measured and further corrections can be determined to correct deviations in these measurements (using the relationships already determined) as part of a control loop.

The concepts described herein will help improve CDU for multiple structure class CDs and as a consequence, will help to increase electrical yield. Considering current desired CDU performance levels and state-of-the-art performance, the impact is expected to be significant for the 5 nm node and below.

While the concepts above are described for control of CD, the concepts are equally applicable to other parameters of interest which may be controlled predictably via control of an exposure control parameter and a process control parameter. In particular the concepts are equally applicable to other such parameters of interest which show different relationships with these control parameters for different structure classes.

While metrology targets described above are metrology targets specifically designed and formed for the purposes of measurement, in other embodiments, properties may be measured on metrology targets which are functional parts of devices formed on the substrate. Many devices have regular, grating-like structures. Metrology target grating and metrology target as used herein do not require that the structure has been provided specifically for the measurement being performed.

An embodiment may include a computer program containing one or more sequences of machine-readable instructions configured to cause performance of methods or other operations described herein. An embodiment may include a computer program containing one or more sequences of machine-readable instructions describing methods of measuring targets on a substrate and/or analyzing measurements to obtain information about a patterning process. There may also be provided a data storage medium (e.g., semiconductor memory, magnetic or optical disk) having such a computer program stored therein. Where an existing lithography or metrology apparatus is already in production and/or in use, an embodiment can be implemented by the provision of updated computer program products for causing a processor to perform the methods described herein.

Although specific reference may have been made above to the use of embodiments in the context of optical lithography, it will be appreciated that the embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The invention may further be described using the following clauses:

1. A method of controlling a parameter of interest for a patterning process, the method comprising:
determining an exposure control correction for an exposure control parameter based upon a determination of the parameter of interest from a structure at a process condition, and based upon an exposure control relationship and a process control relationship,
wherein the exposure control relationship describes the dependence of the parameter of interest on the exposure control parameter and the process control relationship describes the dependence of the parameter of interest on a process control parameter.
2. The method of clause 1, wherein the parameter of interest comprises a critical dimension.

3. The method of clause 1 or clause 2, wherein the exposure control correction is determined for a plurality of locations on the substrate.

4. The method of any preceding clause, wherein determining the exposure control correction is further based upon a determination of the parameter of interest from a structure at an exposure condition.

5. The method of any preceding clause, further comprising determining a process control correction for a process control parameter based upon the determination of the parameter of interest from the structure, the exposure control relationship and the process control relationship.

6. The method of clause 5, comprising combining the exposure control correction and process control correction to increase the correction range relative to that possible with only the exposure control correction or the process control correction.

7. The method of clause 5 or clause 6, comprising co-optimizing the exposure control correction and process control correction to minimize variation of the parameter of interest of a subsequent structure relative to a target parameter of interest.

8. The method according to any of clauses 5 to 7, wherein the process control parameter is an etch control parameter and the process control correction is an etch control correction.

9. The method of clause 8, wherein the etch control parameter comprises temperature, or etch gas mixture, or both.

10. The method of any of clauses 5 to 9, comprising performing a process step to process the structure using the process control correction for the process control parameter.

11. The method of any of clauses 5 to 10, wherein the process control correction is a high order correction over the substrate, the high order correction comprising a fingerprint describing the uniformity of the parameter of interest across the substrate, described by a 10th or higher order 2D polynomial.

12. The method of clause 11, wherein the 2D polynomial comprises a 15th order or higher polynomial.

13. The method of any of clauses 5 to 12, wherein the structure comprises a plurality of structures and the exposure control correction and the process control correction are co-optimized such that the exposure control correction biases the resultant parameter of interest for the structures prior to the process step such that application of the process control correction during the process step acts to minimize variation of the parameter of interest of subsequent exposed and processed structures relative to a target parameter of interest for the structures.

14. The method of any preceding clause, wherein the structure comprises a plurality of structures divisible into two or more structure classes, each structure class having a different exposure control relationship and/or different process control relationship.

15. The method of clause 14, wherein the structure classes comprise a first structure class of dense structures and a second structure class of isolated structures.

16. The method of clause 14 or clause 15, wherein the number of structure classes is two.

17. The method of clause 14 or clause 15, wherein the number of structure classes is more than two.

18. The method of any of clauses 14 to 17, wherein the exposure control correction is determined from a first exposure control relationship describing the dependence of the parameter of interest on the exposure control parameter for a first of the structure classes, a second exposure control relationship describing the dependence of the parameter of interest on the exposure control parameter for a second of the structure classes, a first process control relationship describing the dependence of the parameter of interest on the process control parameter for the first of the structure classes and a second process control relationship describing the dependence of the parameter of interest on the process control parameter for the second of the structure classes.

19. The method of any of clauses 14 to 18, wherein the total number of parameters for which corrections, including the exposure control corrections, are determined for is at least the same as the number of structure classes, wherein the parameters comprise exposure control parameters and process control parameters.

20. The method of any preceding clause, wherein the exposure control correction is a high order correction over the substrate, the high order correction comprising a fingerprint describing the uniformity of the parameter of interest across the substrate, described by a 10th or higher order 2D polynomial.

21. The method of clause 20, wherein the 2D polynomial comprises a 15th order or higher polynomial.

22. The method of any preceding clause, wherein the exposure control parameter comprises dose, or focus, or both.

23. The method of any preceding clause, comprising performing a preliminary step to determine the exposure control relationship and the process control relationship, the preliminary step comprising:

exposing structures, comprising a structure in each of a plurality of structure classes, on one or more exposure calibration substrates with the exposure control parameter being varied, and measuring the parameter of interest on the resultant structures;

processing one or more process calibration substrates comprising a structure in each structure class with different process control parameter settings, and measuring the parameter of interest on the resultant structures;

determining the exposure control relationship from measurements of the exposure calibration substrate(s); and determining the process control relationship from measurements of the process calibration substrate(s).

24. The method of clause 23, wherein the preliminary step further comprises exposing a structure in each structure class on a reference substrate, measuring the reference substrate and determining the exposure control correction and, where applicable, the process control correction for the measurements of the reference substrate.

25. The method of any preceding clause, comprising performing an exposure step to form a structure on a substrate using the exposure control correction for the exposure control parameter.

26. The method of any preceding clause, comprising performing the measurement of a parameter of interest of a plurality of exposed and processed structures on a substrate.

27. A computer program comprising processor readable instructions which, when run on suitable processor controlled apparatus, cause the processor controlled apparatus to perform the method of any preceding clause.

28. A computer program carrier comprising the computer program of clause 27.

29. A lithographic apparatus being operable to perform a patterning process using the exposure control correction for an exposure control parameter determined in the method of any of clauses 1 to 26.

30. The lithographic apparatus of clause 29 operable to perform the method of any of clauses 1 to 26.

31. The lithographic apparatus of clause 29 or clause 30, comprising:

an illumination optical system arranged to illuminate a pattern; and a projection optical system arranged to project an image of the pattern onto a substrate.

32. A metrology apparatus being operable to perform the method of any of clauses 1 to 24.

33. The metrology apparatus of clause 32 being further operable to perform the measurement of a parameter of interest of a plurality of exposed and processed structures on a substrate.

34. The metrology apparatus of clause 32 or clause 33 comprising:

an illumination system configured to illuminate a structure on a substrate; and a detection system configured to detect scattered radiation arising from illumination of the structure.

35. A lithographic cell comprising a lithographic apparatus of any of clauses 29 to 31 and/or a metrology apparatus of any of clauses 32 to 34.

36. A processing apparatus operable to perform one or more processing steps on an exposed substrate using the process control correction for a process control parameter as determined in the method of any of clauses 5 to 13.

37. The processing apparatus of clause 36 comprising an etch apparatus.

38. A method of determining corrections for a parameter of interest of a patterning process, the method comprising:

determining an exposure control correction for an exposure control parameter and determining a process control correction for a process control parameter, based upon a measurement of a parameter of interest of a plurality of exposed and processed structures on a substrate, having been performed after an exposure step and a process step has been performed to form the structures, and further based on an exposure control relationship and a process control relationship, wherein the exposure control relationship describes the dependence of the parameter of interest on the exposure control parameter and the process control relationship describes the dependence of the parameter of interest on the process control parameter.

39. The method of clause 38, wherein the exposure control correction and process control correction are co-optimized to minimize variation of the parameter of interest of subsequent exposed and processed structures relative to a target parameter of interest.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of controlling a parameter of interest for a physical patterning process, the method comprising:

determining an exposure control correction for an exposure control parameter of an exposure in the physical patterning process based upon a determination of a value of the parameter of interest from a structure at a process condition, and based upon an exposure control relationship and a process control relationship, wherein the exposure control relationship describes dependence of the parameter of interest on the exposure control parameter and the process control relationship describes dependence of the parameter of interest on a process control parameter for a materials processing in the physical patterning process other than, or in addition to, the exposure in the physical patterning process.

2. The method of claim 1, wherein the parameter of interest comprises a critical dimension.

3. The method of claim 1, wherein the exposure control correction is determined for a plurality of locations on a substrate.

4. The method of claim 1, further comprising determining a process control correction for a process control parameter based upon the determination of the value of the parameter of interest from the structure, the exposure control relationship and the process control relationship.

5. The method of claim 4, further comprising combining the exposure control correction and process control correction to increase a correction range relative to that possible with only the exposure control correction or only the process control correction.

6. The method of claim 4, further comprising co-optimizing the exposure control correction and process control correction to minimize variation of the parameter of interest of a subsequent structure relative to a target parameter of interest.

7. The method of claim 4, wherein the process control parameter is an etch control parameter and the process control correction is an etch control correction.

8. The method of claim 4, further comprising performing a process step to process the structure using the process control correction for the process control parameter.

9. The method of claim 4, wherein the structure comprises a plurality of structures and the exposure control correction and the process control correction are co-optimized such that the exposure control correction biases the resultant parameter of interest for the structures prior to the process step such that application of the process control correction during the process step acts to minimize variation of the parameter of interest of subsequent exposed and processed structures relative to a target parameter of interest for the structures.

10. A processing apparatus configured to perform one or more processing steps on an exposed substrate using the process control correction for a process control parameter as determined in the method of claim 4.

11. The method of claim 1, wherein the exposure control correction is a high order correction over a substrate, the high order correction comprising a fingerprint describing the uniformity of the parameter of interest across the substrate, the fingerprint described by a 10th or higher order 2D polynomial.

12. The method of claim 1, further comprising determining the exposure control relationship and the process control relationship, the determining comprising:

exposing structures, the structures comprising a structure in each of a plurality of structure classes, on one or more exposure calibration substrates with the exposure control parameter being varied, and measuring the parameter of interest on the resultant structures;

processing one or more process calibration substrates comprising a structure in each structure class, with different process control parameter settings, and measuring the parameter of interest on the resultant structures;

determining the exposure control relationship from the measurements of the exposure calibration substrate(s); and determining the process control relationship from the measurements of the process calibration substrate(s).

13. A lithographic apparatus configured to perform a patterning process using the exposure control correction for an exposure control parameter determined in the method of claim 1.

14. A metrology apparatus configured to perform the method of claim 1, and configured to perform measurement of the parameter of interest of a plurality of exposed and processed structures on a substrate.

15. The method of claim 1, further comprising performing an exposure step to form a structure on a substrate using the exposure control correction for the exposure control parameter.

16. The method of claim 1, wherein the structure comprises a plurality of structures divisible into two or more structure classes, each structure class having a different exposure control relationship and/or different process control relationship.

17. The method of claim 16, wherein the structure classes comprise a first structure class of dense structures and a second structure class of isolated structures.

18. The method of claim 16, wherein the exposure control correction is determined from a first exposure control relationship describing the dependence of the parameter of interest on the exposure control parameter for a first structure class of the structure classes, from a second exposure control relationship describing the dependence of the parameter of interest on the exposure control parameter for a second structure class of the structure classes, from a first process control relationship describing the dependence of the parameter of interest on the process control parameter for the first structure class of the structure classes, and from a second process control relationship describing the dependence of the parameter of interest on the process control parameter for the second structure class of the structure classes.

19. The method of claim 1, wherein the exposure control parameter comprises dose and/or focus.

20. A non-transitory computer program comprising processor readable instructions which, when run on suitable processor controlled apparatus, cause the processor controlled apparatus to at least:

determine an exposure control correction for an exposure control parameter of an exposure in a physical patterning process based upon a determination of value of a parameter of interest from a structure at a process condition, and based upon an exposure control relationship and a process control relationship, wherein the exposure control relationship describes dependence of the parameter of interest on the exposure control parameter and the process control relationship describes dependence of the parameter of interest on a process control parameter for a materials processing in the physical patterning process other than, or in addition to, the exposure in the physical patterning process.

21. A method of determining a correction for a parameter of interest of a physical patterning process, the method comprising:

determining an exposure control correction for an exposure control parameter for an exposure in the physical patterning process and a process control correction for a process control parameter for a materials processing in the physical patterning process other than, or in addition to, the exposure in the physical patterning process, based upon a measurement of the parameter of interest of a plurality of exposed and processed structures on a substrate, the measurement performed after an exposure step and a process step has been performed to form the structures, and further based on an exposure control relationship and a process control relationship, wherein the exposure control relationship describes dependence of the parameter of interest on the exposure control parameter and the process control relationship describes dependence of the parameter of interest on the process control parameter.

* * * * *